United States Patent [19]

Walls

[11] 4,436,804

[45] Mar. 13, 1984

[54] LIGHT-SENSITIVE POLYMERIC DIAZONIUM CONDENSATES AND REPRODUCTION COMPOSITIONS AND MATERIALS THEREWITH

[75] Inventor: John E. Walls, Annandale, N.J.

[73] Assignee: American Hoechst Corporation, Somerville, N.J.

[21] Appl. No.: 359,335

[22] Filed: Mar. 18, 1982

Related U.S. Application Data

[63] Continuation-in-part of Ser. No. 245,837, Mar. 20, 1981, abandoned.

[51] Int. Cl.$^3$ .................... G03C 1/54; C07C 113/04
[52] U.S. Cl. .................................. 430/157; 430/168; 430/169; 430/175; 430/176; 430/302; 430/141; 430/154; 260/141
[58] Field of Search ............... 430/175, 176, 168, 169, 430/157, 302; 260/141 R, 141 P

[56] References Cited

U.S. PATENT DOCUMENTS

| | | |
|---|---|---|
| 3,679,419 | 7/1972 | Gillich . |
| 3,849,392 | 11/1974 | Steppan . |
| 3,867,147 | 2/1975 | Tuescher . |
| 4,288,520 | 9/1981 | Sprintschnik ..................... 430/169 |

FOREIGN PATENT DOCUMENTS 1312926  4/1973  United Kingdom .

*Primary Examiner*—Charles L. Bowers, Jr.
*Attorney, Agent, or Firm*—Michael J. Tully; Leo S. Burnett; Richard S. Roberts

[57] ABSTRACT

This invention relates to novel condensation products, novel light-sensitive condensation products of aromatic diazonium salts, processes for preparation thereof, and to light-sensitive reproduction materials, which latter comprise a support having a reproduction layer containing at least one of the novel light-sensitive products. The light-sensitive condensation products are prepared by first homo-condensing non-diazo containing monomers of the structure R—M—R to form an oligomer. The oligomer is next condensed with an aromatic diazonium salt form the desired novel light-sensitive condensation product. R is a reactive substituent capable of undergoing condensation reactions in acid medium. M is selected from the group consisting of aromatic hydrocarbons, diaryl ethers, diaryl sulfides, diaryl amines, diaryl sulfones, diaryl ketones and diaryl diketones. The resulting novel light-sensitive condensation products have approximately four times the speed of prior art compounds.

27 Claims, No Drawings

LIGHT-SENSITIVE POLYMERIC DIAZONIUM CONDENSATES AND REPRODUCTION COMPOSITIONS AND MATERIALS THEREWITH

This application is a continuation-in-part of applicants' parent application Ser. No. 245,837, filed in the U.S. Patent and Trademark Office on Mar. 20, 1981, abandoned.

TECHNICAL FIELD

This invention relates to novel condensation products, novel light-sensitive condensation products of aromatic diazonium salts, processes for preparation thereof, and to light-sensitive reproduction materials, which latter comprise a support having a reproduction layer thereon containing at least one of the novel light-sensitive products.

BACKGROUND OF THE PRIOR ART

It is known to use light-sensitive aromatic diazonium compounds for sensitizing reproduction materials which are useful for the production of single copies, printing plates, screen printing, color proofing foils and other applications in the reproduction arts.

U.S. Pat. Nos. 3,867,147, 3,679,419 and 3,849,392 relating to mixed diazo condensates, the contents of which are hereby incorporated by reference, describe an advance overcoming disadvantages of prior art diazo compounds and reproductive layers made therefrom, i.e. poor adhesion to metal supports, tendency of metal to decompose the diazo, and high sensitivity of coated layers to moisture resulting in sensitivity to finger-printing and other tendency to damage.

Although the diazo mixed condensates of these patents fulfilled their objectives and have met commercial success, there is a continuing need in the field of graphic arts for materials exhibiting increased light sensitivity and photo-chemical speed.

For laser exposure and projection imaging, not only are higher speed printing plates necessary, they must additionally retain all of the aforementioned advantages: good stability in the form of presensitized plates, resistance to moisture, and ability to give long, uniform printing runs. Further, such plates must have strongly oleophilic images and hydrophilic non-images.

It is an object of this invention to provide higher speed printing plates than have been heretofore available.

It is another object of this invention to provide printing plates suitable for laser exposure and projection imaging.

It is still another object of this invention to provide printing plates with long uniform run characteristics, resistance to moisture and low sensitivity to metal supports in addition to the aforementioned characteristics.

It is a further object to prepare condensation products suitable for reaction with diazo monomers in the preparation of light-sensitive compounds.

It is a still further object of this invention to provide a class of novel light-sensitive diazo compounds which are inherently more sensitive to light and by the use of which the aforementioned characteristics may be obtained.

These and other objects are achieved by the invention described herein.

BRIEF SUMMARY OF THE INVENTION

The present invention relates to compounds produced by condensation having end groups capable of reacting with aromatic diazonium compounds, a process for making these compounds, and novel light-sensitive compounds produced by condensation of the aforesaid condensation products with aromatic diazonium compounds.

The novel condensation products are predominantly represented by the Formula I:

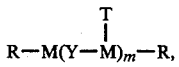

wherein:

R is selected from the group consisting of

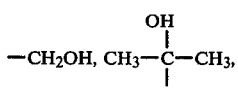

—CH₂Cl, and —CH₂Br;

n is an integer from 0 to 3;

M is an aromatic radical of one or more compounds selected from the group consisting of aromatic hydrocarbons, diaryl ethers, diaryl sulfides, diaryl amines, diaryl sulfones, diaryl ketones, and diaryl diketones;

m is 1 to about 9;

Y is selected from the group consisting of —CH₂— and —CH₂OCH₂—; and

T is the same as R when Y is —CH₂— and is hydrogen when Y is —CH₂—O—CH₂—.

These compounds are oligomers and mixtures of oligomers obtained by condensation of R—M—R to form substantially linear polymeric diazo reactive compounds.

Aromatic hydrocarbon radicals within the scope of the M radical defined above may include benzene, naphthalene, anthracene, and other condensed aromatics, biphenyl, diaryl alkanes such as diphenyl methane, diphenyl ethane and diphenyl isopropane, and like materials. Also included within the scope of the definition of the aromatic hydrocarbon radical as well as the diaryl radicals within the definition of M above are ring substituents other than the substituents within the definition of R above, which do not interfere with the condensation reaction. Such substituent groups include halogen, hydroxy, lower alkyl, phenyl and phenoxy.

Two different R—M—R molecules may be mixed before condensation, in which case a co-condensation takes place. In such cases condensable monomers may be used containing R, M and R moieties of differing chemical constitution. The novel light-sensitive compounds are obtained by the condensation of the aforesaid oligomers with aromatic diazonium compounds represented by the Formula II:

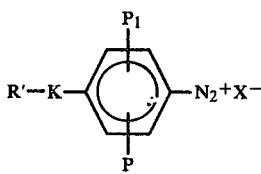

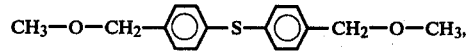

4,4'-Bis-methoxymethyl diphenyl sulfide, is dissolved in 85% orthophosphoric acid. It first dimerizes to form an oligomer as shown by Formula IV:

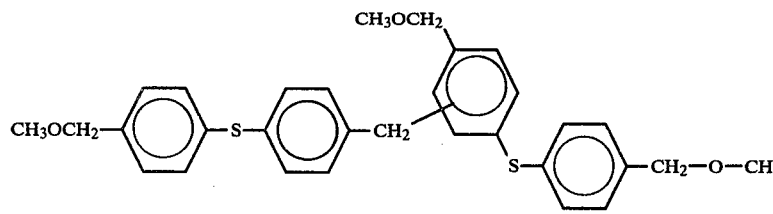

wherein

R' is selected from the group consisting of phenyl and $C_1$ to $C_4$ alkyl substituted phenyl.

—K— is selected from the group consisting of

—S—, —O—, and —CH$_2$—, or is absent;

P and $P_1$ are selected from the group consisting of $C_1$ to $C_4$ alkyl, methoxy, ethoxy, butoxy, and H;

$P_1$ may be the same as P or different; and $X^-$ is an anion.

Where $R^1$ is a substituted phenyl in the above formula, the substituent group is preferably located in the para position and its preferred substituent group is methyl, i.e., p-tolyl.

A suitable anion is one which confers water solubility and permits dissolution in the selected condensing acid. Preferred anions are selected from the group consisting of $SO_4$, $PO_4$, $Cl^-$, $Br^-$, $F^-$, and $NO_3^-$.

The chemistry of the reaction would indicate that the oligomer and the aromatic diazonium compound are connected primarily by methylene groups.

Reproduction layers are obtained by coating the novel light sensitive compounds on a base. When printing plates are prepared with these compounds, they exhibit about 2 to 11 times the light speed of conventional plates, while retaining good run length and clean impressions.

DETAILED DESCRIPTION OF THE INVENTION

By means of the invention a new class of diazonium salt sensitizers has been prepared. This has been accomplished by a sequence of two separate reactions which may be shown schematically as follows:

1. Non-diazo con-  <u>condensation</u>  Oligomer
   taining monomer                    mixture 2. Oligomer + Diazo  <u>condensation</u>  Diazo
   mixture   Monomer                   Condensate To form the oligomer mixture, numerous monomers, shown later, are suitable. However, to illustrate the reaction, one such monomer as shown by Formula III:

By continuing the reaction by condensation of another monomer unit, a trimer, is formed. In similar manner, tetramers and pentamers will be formed. The oligomerization reaction is controlled and is preferably arrested when no species higher than about the heptamer is formed. In Formula I, m is 1 to about 6. This upper number is not critical but is coincident with the onset of partial insolubility of the crude oligomer reaction product. The reaction mixture now contains unchanged monomer, dimer, trimer, etc. molecules up to the highest oligomer that has been formed.

As will be shown in Example 11, it is possible to separate the mixture and isolate the individual oligomer units. However, in general, this is not necessary unless the highest possible light speed is desired without regard to a possible detrimental affect due to decreased aging characteristics.

Next, as shown above, the oligomer mixture is condensed with a known diazo monomer. By way of illustration,

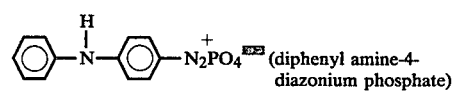

is selected. This salt, dissolved in 85% orthophosphoric acid w/w (all percentages are by weight, unless otherwise stated), is mixed with the oligomer mixture and condensed to form a diazonium condensation polymer composed of repeating units of moieties from the oligomer and the diazo monomer. By isolating the product as a phosphate, chloride, bromide, or sulfate salt, a water soluble diazonium salt is obtained. By isolating the product as an aromatic sulfonate, hexafluorophosphate, or tetrafluoroborate, a solvent soluble diazonium salt is obtained. These salts are suitable for making, for example, printing plates by coating them on an aluminum support. They exhibit much higher light speeds than have been hitherto available.

Numerous non-diazo containing monomers are suitable for oligomerization and their oligomers are suitable for condensation with diazo monomers to make the novel diazonium salts of this invention. Many of these monomers are listed below. However, their structures may be generalized as shown in Formula V:

R—M—R                                    V wherein each R and M radicals are as defined in connection with Formula I above.

Preferred monomers within the scope of Formula V are materials wherein the radical forming the M moiety is based on a substituted or unsubstituted benzene or unsubstituted or substituted diphenyl compounds such as diphenyl either, diphenyl methane, diphenyl ethane, diphenyl sulfide, diphenyl sulfone, diphenyl amine and diphenyl ketones.

M=an aromatic radical of a compound selected from the group consisting of aromatic hydrocarbons, diaryl ethers, diaryl sulfides, diaryl sulfones, diaryl ethers, diaryl amines, diaryl ketones, and diaryl diketones.

Non-Diazo Containing Monomers

Suitable monomers for homo- or co-condensation include but are not limited to:
1,3-dihydroxymethyl benzene
1,4-dimethoxymethyl benzene
1,5-diacetoxymethyl naphthalene
1,4-dihydroxymethyl naphthalene
9,10-dimethoxymethyl anthracene
2,5-dimethoxymethyl thiophene
1,4-(dimethyl methylol) benzene
1,4dimethylol benzene
2,6-dihydroxymethyl naphthalene
1,4-di(4-hydroxybenzyl) benzene
4,6-Dimethyl-1,3-dihydroxymethyl benzene
2,5-Dimethyl-1,4-dihydroxymethyl benzene
2,4,6-Trimethyl-1,3-dihydroxymethyl benzene
2,4,6-Trimethyl-1,3,5-trimethoxymethyl benzene
2,3,5,6-Tetramethyl-1,4-diacetoxymethyl benzene
2,4,5,6-Tetramethyl-1,3-diethoxymethyl benzene
4,4'-Bis-acetoxymethyl diphenylmethane
4,4'-Bis-methoxymethyl diphenylmethane
2-Methyl-1,5-diacetoxymethyl naphthalene
2-Ethyl-9,10-dimethoxymethyl anthracene
4,6-Diisopropyl-1,3-dihydroxymethyl benzene
4,6-Diisopropyl-1,3-dimethoxymethyl benzene
4,4'-Bis-acetoxymethyl diphenylsulfone
4,4'-Bis-methoxymethyl benzophenone
6-Hydroxy-2,4-dimethyl-1,3,5-trihydroxymethyl benzene
6-Acetoxy-3-methyl-1,5-diacetoxymethyl benzene
5-Chloro-2-hydroxy-1,3-dihydroxymethyl benzene
5-t-butyl-2-hydroxy-1,3-dimethoxymethyl benzene
5-Benzyl-2-acetoxy-1,3-diacetoxymethyl benzene
5-Phenoxy-2-hydroxy-1,3-dihydroxymethyl benzene
5-Methoxycarbonyl-2-hydroxy-1,3-dihydroxymethyl benzene
5-Cumyl-2-hydroxy-1,3-dimethoxymethyl benzene
5-Methylmercapto-2-hydroxy-1,3-dihydroxymethyl benzene
5-Ethoxy-2-hydroxy-1,3-dimethoxymethyl benzene
5-Fluoro-2-hydroxy-6-methyl-1,3-dihydroxymethyl benzene
5-Chloro-2-hydroxy-4,6-dimethyl-1,3-dihydroxymethyl benzene
5-Chloro-4-hydroxy-2-methyl-1,3-dihydroxymethyl benzene
Dihydroxymethyl hydroquinone
4-Hydroxy-3,5'-bis-hydroxymethyl diphenylether
2,2-(4-hydroxy-3,5-dihydroxymethyl-phenyl) propane
Bis-(4-hydroxy-5-methyl-3-hydroxymethyl-phenyl) sulfone
2,3-Dihydroxy-1,4-dihydroxymethyl benzene
2-Hydroxy-3-methoxy-hydroxymethyl benzene
2,2'-Bis-Hydroxy-3,3'-bis-hydroxymethyl diphenylmethane
1,3-(3-hydroxymethyl-phenoxy) propane
1,5-(4-hydroxymethyl-phenoxy) pentane
1,3-Dimethoxymethyl-2-methoxy-5-fluoro benzene
1,3-Dimethoxymethyl-2-ethoxy-5-methoxy benzene
1,3-Dimethoxymethyl-2-methoxy-5-phenyl benzene
Bis-[2-(4-hydroxymethyl-phenoxy)]ethyl ether
1,3-Dimethoxymethyl-2-ethoxy-5-bromo benzene
1,3-Diacetoxymethyl-2-ethoxy-5-butyl benzene
1,3-Diacetoxymethyl-2-methoxy-5-phenylmercapto benzene
1,3-Diacetoxymethyl-2-methoxy-5-chloro benzene
1,3-Diacetoxymethyl-2,5-dimethoxy benzene
1,3-(2-methyl-4-benzyl-6-hydroxymethylphenoxy) propane
2,2'-Bis-methoxy-3,3'-bis-hydroxymethyl-5,5'-dimethyl-diphenyl-methane
Dihydroxymethyl-hydroquinone dimethyl ether
4-Methoxy-3,5'-bis-hydroxymethyl diphenyl ether
Bis-(4-ethoxy-5-methyl-3-hydroxymethyl-phenyl) sulfone
4-Methoxymethyl diphenyl ether
2-Hydroxymethyl diphenyl ether
4,4'-Bis-hydroxymethyl diphenyl ether
4,4'-Bis-acetoxymethyl diphenyl ether
4,4'-Bis-methoxymethyl diphenyl ether
4,4'-Bis-ethoxymethyl diphenyl ether
2,4'-Bis-methoxymethyl diphenyl ether
2,4,4'-Tris-methoxymethyl diphenyl ether
2,2',4-Tris-methoxymethyl diphenyl ether
2,2',4,4'-Tetrakis-methoxymethyl diphenyl ether
3,3'-Bis-methoxymethyl-4,4'-dimethyl diphenyl ether
3,3'-Bis-methoxymethyl-2,4'-dimethoxy-5-methyl diphenyl ether
4,4'-Bis-methoxymethyl-3,3'-Bis-methyl diphenyl sulfide
3,3'-Bis-methoxymethyl-2,4'-Bis-methoxy diphenyl sulfide
2,2'-Bis-methyl-4,4'-bis-hydroxymethyl diphenyl ether
4-Chloro-4'-methoxymethyl diphenyl ether
1,3-(4-methoxymethyl-phenoxy) benzene
1,3-(4-methoxymethyl-phenoxy) propane
4,4'-Bis-methoxymethyl diphenyl sulfide
6-Methylmercapto-3-methyl-hydroxymethyl benzene
2,2-[4-(4-methoxymethyl-phenoxy)-phenyl]propane
4,4'-Bis-phenoxymethyl diphenyl ether
3,3'-Bis-methoxymethyl-4-phenoxy diphenyl sulfide
4,4'-Bis-methoxymethyl-2-isopropyl-5-methyl diphenyl ether
2,4'-Bis-methoxymethyl-3-bromo-4-methoxy diphenyl ether
2,4'-Bis-methoxymethyl-4-nitro diphenyl ether
4,4'-Bis-dimethoxy benzoin
3,3'-Bis-methoxymethyl-benzidine
4,4'-Bis-dimethoxy benzil
3,3'-Bis-dimethoxy benzidine Other monomers suitable for co-condensation with the above listed monomers include:
Benzylalcohol
Dibenzylether
1-Hydroxymethyl naphthalene
2-Hydroxymethyl naphthalene
9-Hydroxymethyl phenanthrene
2-Hydroxymethyl furan
Benzhydrol
3-Methyl-hydroxymethyl benzene
2,5-Dimethyl-hydroxymethyl benzene 2-Methyl-5-isopropyl-hydroxymethyl benzene
2,4-Diisopropyl-hydroxymethyl benzene
6-Chloro-1-hydroxymethyl naphthalene
4-Chloro-hydroxymethyl benzene
2-Hydroxy-hydroxymethyl benzene
3,5-Dibromo-2-hydroxy-hydroxymethyl benzene
2,2'-Dihydroxymethyl-dibenzyl ether
3,4-Dihydroxy hydroxymethyl benzene
Formaldehyde Although all the above are suitable to some degree, most particularly preferred are the following:
4,4'-Bis-hydroxymethyl diphenyl ether
4,4'-Bis-acetoxymethyl diphenyl ether
4,4'-Bis-methoxymethyl diphenyl ether
4,4'-Bis-ethoxymethyl diphenyl ether
2,4'-methoxymethyl diphenyl ether
4,4'-Bis-phenoxymethyl diphenyl ether
4-Hydroxy-3,5'-bis-hydroxymethyl diphenyl ether
2,2'-Bis-methyl-4,4'-bis-hydroxymethyl diphenyl ether
3,3'-Bis-methoxymethyl-4,4'-Bis-methyl diphenyl ether
3,3'-Bis-methoxymethyl-2,4-dimethoxy-5-methyl diphenyl ether
2,2'-Bis-hydroxymethyl dibenzyl ether
4,4'-Bis-methoxymethyl diphenyl sulfide
4,4'-Bis-methoxymethyl-3,3'-Bis-methyl diphenyl sulfide
3,3'-Bis-methoxymethyl-2,4'-Bis-methoxy diphenylsulfide
4,4'-Bis-methoxymethyl diphenylmethane
4,4'-Bis-acetoxymethyl diphenylmethane
2,2'-Bis-hydroxy-3,3'-bis-hydroxymethyl diphenylmethane
2,2-(4-hydroxy-3,5-dihydroxymethyl-phenyl) propane
2,4,6-Trimethyl-1,3,5-trimethoxymethyl benzene
2,4,6-Trimethyl-1,3-dihydroxymethyl benzene
2,5-Dimethyl-1,4-hydroxymethyl benzene
Bis-[2-(4-hydroxy methyl-phenoxy)]ethyl ether
4,4'-Bis-methoxymethyl benzophenone
4,4'-Bis-acetoxymethyl diphenylsulfone
Bis-(4-hydroxy-5-methyl-3-hydroxymethyl-phenyl) sulfone Oligomerization (Homo and Co-Condensation)

The products of condensation of the above monomers are oligomers of the general Formula I. set forth above.

In order to generate useful products, the condensations must be carried out under such conditions and with such reagents that an undesirable exotherm is not allowed. Unless great care is taken, in procedures shortly to be described, a runaway reaction may take place with formation of products of excessive molecular weight. Oligomers of suitable molecular weight are generally soluble in the condensation medium and further, after condensation with a diazo monomer, form light-sensitive condensation products which remain soluble in useful conventional coating solvents such as butyl acetate, diisobutyl ketone, pentanone, 2-methoxy ethanol, and dimethyl formamide.

Condensations are normally conducted in strong acid media. Suitable acids include $H_3PO_4$, $H_2SO_4$, HCl, HBr, $HPF_6$, $H_3PO_3$, $HBF_4$ at concentrations of 70–100%. Preferred acids are $H_3PO_4$ and $H_2SO_4$. For $H_2SO_4$ 96% w/w is a preferred concentration when this acid is used.

The suitability of the acid depends upon the reactivity of the monomer. $H_2SO_4$ is normally the strongest acid and its use should be reserved for the least reactive monomers for which it then becomes the preferred species.

In certain cases too great activity of the pure acid can be moderated by dilution with a non-polar solvent. For example, 4,4'-Bis-methoxymethyl diphenyl ether when reacted in undiluted $H_2SO_4$ forms an insoluble precipitate with strong exotherm which is not controllable by a reduced rate of addition or by strong cooling.

In this and in most cases $H_3PO_4$ is the preferred medium. However, dilution of one part of $H_2SO_4$ (concentrated) with 4 parts of 1,4-dioxane will in most cases prevent formation of insoluble, intractable precipitates. Although a useable precondensate forms, difficulties of separation to obtain the desired compound make the use of a different, undiluted acid more desirable. In this case no problem is encountered when using 85% $H_3PO_4$.

In some cases $H_2SO_4$ is needed to cause precondensation especially with aliphatic monomers, linear and branched. In some instances, heterocyclic aromatic compounds are best reacted in $H_2SO_4$. However, symmetrical aromatic and alkyl aryl compounds are generally best reacted in $H_3PO_4$.

The procedure of mixing condensation monomer with acid may be carried out either by adding monomer to acid or acid to monomer. In almost all cases it is preferable to add the monomers to the acid with vigorous agitation. In some cases it is necessary to control an exotherm by cooling.

Further, the rate of addition is more critical when $H_2SO_4$ is used (always with vigorous agitation), when it should be dropwise. In the case of $H_3PO_4$ no significant difference in the end product is normally observed whether monomer is added slowly or all at once.

Orthophosphoric acid, the generally preferred condensation medium, is used at a concentration of 80 to 100% w/w, but about 85% w/w is most preferred. The temperature of condensation for various acids may range from about $-10°$ to $70°$ C. but is preferably between about $-10°$ and $50°$ C., and most preferable between about $5°$ and $50°$ C.

Monomer may be used with condensing acid in a ratio of one part by weight of monomer to one part by weight of acid up to four parts by weight of acid. However, it is generally preferred to use one part of weight of monomer to about 1.5 parts by weight of acid.

Longer reaction time increases the number of units of monomer in the oligomer chain, resulting in higher light speeds and generally lower heat stability after condensation with diazo monomer.

The average number of monomer units in the oligomer should range from about 1.3 to the point of incipient insolubility in condensing acid, and preferably from about 1.7 to 2.0.

Excessive prolongation of the homocondensation reaction results in insoluble polymers (higher molecular weight than the desired oligomers) which are no longer suitable to condense with diazo monomers.

When the homo, or co-condensation reaction has been run for the desired time, it is quenched by addition of a large volume of water which also precipitates the reaction product. Several water washings are made to ensure the total removal of acid which would catalyze the continued reaction of the oligomer. The precipitate is dried and is now ready for reaction with the diazo monomer.

Further, it is possible to obtain useful products by the co-condensation of the non-diazo containing monomer with formaldehyde, e.g. in the form of paraformaldehyde, which is first dissolved in the reaction medium.

To determine the actual composition of an oligomer from the homocondensation of 4,4'-Bis-methoxymethyl diphenylether, a mixture suitable for condensation with a diazo monomer was fractionated and the individual oligomer components isolated and analyzed. The details are given in Example 11. After separation of a portion of insoluble residue, the composition was as follows:

| Fraction | % (W/W) | Description PRODUCT | Y bridge |
|---|---|---|---|
| 1 | 25.0 | monomer | |
| 2 | 5.6 | dimer | dimethylene ether |
| 3 | 9.4 | dimer | methylene |
| 4 | 9.8 | trimer | methylene |
| 5 | 17.7 | trimer | both methylene and dimethylene ether |
| 6 | 13.5 | trimer | same as #5 but with —OH termination |
| 7 | 19.0 | washout-tetramer and higher | |

It is believed that in this series condensation is of two types. According to this belief, in the first case a methylene bridge is formed when the aromatic ring of the second monomer is protonated at a position other than that of the R-substituent. This leaves the R group in place and is represented by a T in Formula I, above. In the second type, it is believed that the condensation involves an R substituents of the two reactants, resulting in a —$CH_2$—O—$CH_2$— (dimethylene ether) bridge.

The individual components were condensed with 4-diazodiphenylamine sulfate to form light-sensitive condensation products. When these were coated on a suitable aluminum support the light speed of the coating increased with the number of units in the oligomer up to 11 times (for the highest fraction) that obtained when the unchanged monomer was condensed with the diazo monomer. The latter will be recognized as the subject matter of U.S. Pat. Nos. 3,679,419, 3,849,392 and 3,867,147. The result of the present invention is the desired increase in light speed achieved by controlled precondensation in the manner just described.

Where the highest light speed is required, the isolation and use of one of the higher oligomers makes this possible. However, it is generally more economical to employ the unfractionated reaction mixture which still gives a speed increase of up to four fold or more over the prior art.

It will be seen that there are three kinds of oligomer mixtures and all are suitable in this invention. The first is the mixture obtained by the homocondensation of a single non-diazo containing monomer. This is a mixture of dimers, trimers, tetramers, etc. and their isomers.

A second kind of mixture is obtained by condensing two or more different suitable monomers. This co-condensation forms a mixture of oligomers which have one, two or more of the different monomers in the same chain, in a statistically determined proportion.

A third kind of mixture is that formed by physically mixing the oligomer products from two or more separately conducted homocondensation or co-condensation reactions.

Each of these mixtures is valuable in this invention because in all cases the spacing between reactive sites has been increased relative to the original monomer, and in the subsequent condensation with diazo monomers, the distance between diazo groups has been increased. The benefit from this increase in spacing is discussed below in the next section.

Condensation to Form Light-Sensitive Diazonium Salts

The oligomer product is next condensed with a diazo monomer in a conventional manner, e.g. as in U.S. Pat. No. 3,849,392 and isolated by standard techniques as disclosed in this patent.

Suitable diazo monomers for condensation with the above described oligomers or oligomer mixtures may be represented as shown in Formula II above.

Individual suitable diazo monomers include but are not restricted to the following:
Diphenylamine-4-diazonium chloride,
Diphenylamine-4-diazonium bromide,
Diphenylamine-4-diazonium sulfate,
3-methoxy-diphenylamine-4-diazonium sulfate,
3-methoxy-diphenylamine-4-diazonium chloride,
3-methoxy-diphenylamine-4-diazonium bromide,
3-ethoxy-diphenylamine-4-diazonium chloride,
3-ethoxy-diphenylamine-4-diazonium bromide,
3-ethoxy-diphenylamine-4-diazonium sulfate,
2-methoxy-diphenylamine-4-diazonium chloride,
2-methoxy-diphenylamine-4-diazonium sulfate,
4-methoxy-diphenylamine-4-diazonium sulfate,
4-methoxy-diphenylamine-4-diazonium chloride,
4-methyl-diphenylamine-4-diazonium chloride,
4-methyl-diphenylamine-4-diazonium sulfate,
3-methyl-diphenylamine-4-diazonium chloride,
3-methyl-diphenylamine-4-diazonium sulfate,
3-ethyl-diphenylamine-4-diazonium chloride,
3,3'-Bis-methyl-diphenylamine-4-diazonium chloride,
3-methyl-6-methoxy-diphenylamine-4-diazonium chloride,
2-methyl-5-chloro-diphenylamine-4-diazonium sulfate,
3-chloro-diphenylamine-4-diazonium sulfate,
Diphenylamine-4-diazonium chloride 2-carboxylic acid,
3-isopropyloxy-diphenylamine 4-diazonium chloride,
4-n-butyloxy-diphenylamine-4-diazonium chloride,
2,5-diethoxy-diphenylamine-4-diazonium chloride,
4-methoxy-2-ethoxy-diphenylamine-4-diazonium chloride,
3-isoamyloxy-diphenylamine-4-diazonium chloride, 3,4-dimethoxy-diphenylamine-4-diazonium chloride,
2-n-propyloxy-diphenylamine-4-diazonium chloride,
2-n-butyloxy-diphenylamine-4-diazonium chloride,
4-(4-methoxy-phenylmercapto)-2,5-diethoxy-benzenediazonium chloride Additional suitable diazo monomers include:
4-diazo-2,5-diethoxy-1-(4-tolylmercapto)benzene chloride
4-diazo-2,5-diethoxy-1-(4-tolylmercapto)benzene sulfate
4-diazo-2,5-diethoxy-1-(4-tolylmercapto)benzene bromide
p-diazo-N-ethyl-N-benzylaniline chloride
p-diazo-N-ethyl-N-benzylaniline sulfate
p-diazo-N-ethyl-N-benzylaniline bromide.

It is to be understood that the anions shown with their specific cations above, may in most cases be interchanged and selected from the anions given with the general formula for diazo monomers shown supra.

In conducting the condensation reaction diazo monomers are used such as phosphates, chlorides, bromides, sulfates, nitrates, or fluorides. Such monomers are water soluble and as is essential, soluble in the condensing acid. When the reaction has been completed, using conditions to be described below, it is terminated usually by quenching by the addition of a large excess of water which forms a dilute solution of the product. If it is desired to isolate the product in a water-soluble form it is recovered by salting out, typically by adding 50% zinc chloride solution, for example as described in U.S. Pat. No. 3,849,392, Example 1. Such a product is suitable, for example, for use in wipe-on plates and the initially present anion is retained.

If a water-insoluble and solvent-soluble product is desired, instead of salting out as just described, an acid is added to precipitate the condensate from its aqueous solution, preferably in a filterable form, leaving the initial anion behind in solution, replacing it with the new anion which confers solvent solubility. Such acids are listed in U.S. Pat. No. 3,849,392, Col. 17, lines 34–50, except aliphatic phosphonic acids or methane sulfonic acid, which is included herein by reference. Such acids include, fluoroboric, hexafluorophosphoric, toluene sulfonic, mesitylenesulfonic and numerous other aromatic sulfonic acids which have been found to be particularly suitable.

The filtered precipitate may be used as is or further purified by redissolving in solvent and reprecipitating with water.

These solvent-soluble condensates are well-suited for use in coating formulations which include organic resins and other solvent soluble ingredients. Presensitized printing plates may be prepared in this manner.

By using an oligomer which is terminated by at least two groups capable of reacting with a diazo monomer the resulting condensation polymers will have repeating units of oligomer and diazo in its composition linked by methylene groups, in accordance with the condensation product of units of each of the general types $[Q][E^+X^-]$. The units of oligomer can be represented by Q which is a radical of the compound of Formula I above. The units of diazo can be represented by $E^+X^-$ which is a radical of the compound of Formula II above. In this formula $X^-$ can be any of the anions discussed above, including those which confer water solubility upon the condensate, as well as those which confer solvent solubility.

Preferred diazo monomers are 3-methoxy-diphenylamine-4-diazonium chloride and 3-ethoxy-diphenylamine-4-diazonium chloride as well as the same cations as their chloride sulfate and bromide salts, and also 4-diazo-2,5 diethoxy-(4-tolyl mercapto)benzene as the chloride, bromide or sulfate salts.

The light-sensitive compound is formed by the condensation of an oligomer or oligomer mixture with a diazo monomer.

It is advantageous to condense an oligomer with diazo monomer in a range of about 0.8 to 1.3 moles of oligomer to one mole of diazo salt monomer, preferably 0.9 to 1.1 moles of oligomer to one mole of diazo salt.

Both $H_2PO_4$ and $H_2SO_4$ at about 85% w/w for $H_3PO_4$ and about 96% w/w for $H_2SO_4$ are preferred although other concentrations may be used.

In general, temperatures of about 20° to 50° C., and times of 12-24 hours are used when $H_3PO_4$ is the condensing medium. If $H_2SO_4$, then temperatures of about $-5°$ C. to 18° C. for 10-20 hours are employed.

In the preferred embodiment, the condensation polymer has an average molar ratio of 1 diazo to about 1.7 monomer units in its oligomer moiety when the initially formed oligomer mixture is used. This is due to the fact that the oligomer portion which reacted with the diazo monomer is composed of monomer, dimers, trimers, etc. In the prior art condensation compounds of U.S. Pat. No. 3,849,392, this ratio was analyzed and found to be 1:1, indicating presence of monomer only.

Further, and most important, the spacing of the diazo groups is increased over the prior art so that the optical diazo density in the molecule is reduced. It is believed that, as a result of this spacing, the increase in light speed is achieved because more of the diazo groups are available for photon interception which results in insolubilization and solubility distinction between image (light-struck) and non-image areas. Thus, a material of improved photo efficiency and speed is obtained.

It follows from the above that the chemical composition or the identity of the oligomer may not be as material as the establishment of sufficient chain length to provide proper spacing so long as the oligomer be at least difunctional and terminated by groups reactive with a diazo monomer.

The distance between diazo group in the light-sensitive condensates should be at least 5 Å, more preferably at least about 20 Å. The upper limit in molecular weight is limited in that the condensate must be soluble in coating solvents as set forth above. This distance is in turn governed by the distance between reactive sites of the substantially linear oligomeric diazo reactive monomers having the structure of Formula I. In general, the light sensitive condensates have an average upper limit molecular weight of about 60,000.

The molar ratios of oligomer or oligomer mixture to diazo monomer in the condensation should be approximately equimolar as is conventional in the formation of condensation polymers.

Heat stability may be improved by additions of phosphoric, citric, or tartaric acids in amounts less than about 0.1% as is known in the art.

Reproduction Layers Using New Light-Sensitive Diazonium Salts

The light-sensitive diazonium salts prepared according to the invention may be used in reproduction layers in the conventional way. They may be dissolved in water or solvents and coated on supports to form printing plates, color proofing foils, resists for printed circuitry and the like.

Supports may include grained aluminum, transparent plastic sheets, paper, copper, and the like.

The layer compositions may also include other additives known in the art such as pigments, dyestuffs, polymer binders, plasticizers, wetting agents, sensitizers, indicators and the like. Such additives are detailed in U.S. Pat. No. 3,679,419, column 6 et seq., already made part of this application.

All additives should be so selected, of course, that they are compatible with the diazo condensates and absorb light to as low a degree as possible in the wavelength range important for light-decomposition of the diazo compounds. Water-insoluble polymers are used as binders to strengthen the image. Water or aqueous alkali soluble binders are used to enhance developability of reproduction layers and may be used in color proofing foils and printing plates to strengthen images. The water-soluble or insoluble-polymers generally are used in quantities from 1 to 50 parts by weight per 1 part by weight of diazo compound, preferably not more than 10 parts by weight.

Pigments when used in combination with polymers, are added in quantities ranging from 1 to 50 percent by weight, calculated on the weight of the polymer.

Plasticizers, dyestuffs, wetting agents, sensitizers and indicators are incorporated into the reproduction layers in amounts from 0.1 to 20%, preferably not exceeding 10 percent by weight, calculated on the weight of the other layer constituents.

Known light-sensitive systems may be added to reproduction layers containing the new diazo condensates. These include, but are not limited to, the formaldehyde condensates of substituted or unsubstituted 4-diazo diphenylamine, and the mixed condensates of U.S. Pat. Nos. 3,679,419, 3,849,392, and 3,867,147.

Suitable solvents are enumerated in U.S. Pat. No. 3,849,392. Some of those include the aforementioned butyl acetate, diisobutyl ketone, pentanone, 2-methoxy ethanol, and dimethyl formamide, primarily useful when the light-sensitive condensates are isolated with anions that confer solvent solubility such as the $BF_4^-$, $PF_6^-$, and numerous aromatic sulfonates discussed above. Additional suitable solvents for this purpose include dioxane, tetrahydrofuran, ethylene glycol monomethyl ether acetate, and cyclohexanone. The formulator of coatings will have little difficulty in selecting solvents and solvent mixtures to meet the needs of the selected coating process, taking into account the solubilities of all of the other coating ingredients and the requirement to produce uniform, defect-free coatings.

Suitable solvents when the condensates have been isolated with water-soluble anions, are of course water, as well as lower aliphatic alcohols and other water miscible solvents. These anions include, the chloride, bromide, sulfate, and phosphate.

Reproduction materials may be used directly after production, or at a later date. It is advantageous to store them in a cool, dry place.

The reproduction material is processed by image-wise exposure to light. Any light source, conventional for reproduction purposes, may be used which emits in the long-wave ultraviolet and in the short-wave visible range.

Lasers are particularly useful and when coupled to computer sources and beam-modulation equipment, permit printing plates to be exposed directly without the need for intermediate, fullsize negatives and preparation of paste-ups. Great economics of process are made possible. Exposed plates are automatically transported to processing machines, which develop, finish, dry, and crimp the plate.

Hitherto, the weak link has been the low speed of the mainly diazo-based light sensitive coating. The increased light speed obtained by this invention goes far to permit total automation of the printing plate production process involving laser exposure.

Exposure with high speed laser systems are measured directly in energy units such as watts (W), milliwatts (mW), and millijoules (mJ) rather than seconds or integrated exposure units. High energy lasers used for the exposure of offset printing plates utilize are Argon ion, Krypton, Helium-Cadmium, carbon dioxide and others still in development.

Laser equipment economy depends upon having a plate with a high light sensitivity. Whereas present systems require 12–14 $mJ/cm^2$ and as high as 25 $mJ/cm^2$ to properly expose a plate with concurrently shortening laser life, with the present invention as little as 4 $mJ/cm^2$ may serve for sufficient exposure.

Using conventional light sources, light-speed is evaluated by exposing a coated plate through a 21 step Stouffer step-wedge. This is a transparency in which each step is 1.414 times ($\sqrt{2}$) denser than the last step, so that, for example, the third step has twice the density of the first step.

After development and inking the exposed plate, relative speed assessments may be made. In addition, they correlate with energy requirements in laser exposure. The image of the step wedge on the plate will show a succession of gray steps leading to a solid black at one end and beginning with so faint a gray at the other end of the scale that no step is seen. As the steps are permanently numbered in the transparency, it is possible to have a reading, for example, of Solid 5 and Ghost 2. The solid step number is interpreted only in comparison to another plate exposed and developed in an identical manner showing, say Solid 7, Ghost 4. In this case, the second plate has twice the light-speed of the first ($\sqrt{2} \times \sqrt{2}$) and the scale is in each case 3 steps, showing moderate contrast.

After exposure to light, development is effected with a suitable developer. Suitable developers are, for example, water, mixtures of water with organic solvents, aqueous salt solutions, aqueous solutions of acids, e.g. of phosphoric acid, to which salts or organic solvents maybe added, or alkaline developers, e.g. aqueous solutions of sodium salts of phosphoric acid or silicic acid. Also organic solvents may be added to these developers. In some cases, it is also possible to develop with undiluted organic solvents. The developers may contain additional constituents, e.g. wetting agents and hydrophilizing agents.

Development is performed in known manner, e.g. by immersing or wiping over or rinsing with the developer liquid.

Depending upon the composition of the layer, the supporting material, and processing, it is possible to produce with the new diazo condensates single copies, relief images, tanned images, printing forms for relief printing, intaglio printing, and planographic printing, or printed circuits.

In the following examples, preferred embodiments of the invention are described without limiting the scope of the invention thereby. Unless otherwise stated, percentages are by weight; parts by weight and parts by volume relate to each other as grams to milliliters. All temperatures are given in degrees centigrade.

EXAMPLE 1

A non-diazo-containing oligomer was prepared by adding 25.7 gr of 1,4-dimethylol benzene monomer to 32.2 gr of 96% (w/w) sulfuric acid in a portionwise fashion while maintaining a constant temperature of 20° C. and providing vigorous agitation. Upon completing the addition of the monomer to the acid and while maintaining agitation and constant temperature, the slurry that was formed was aged for 1½ hours. After aging, approximately 0.2 gr of the oligomer slurry was removed and set aside for a test to be described below. The aged oligomer-acid mixture was added to a solution of 18.9 gr of 4-diazo diphenyl amine sulfate which was previously dissolved in 96.5 gr of sulfuric acid. The addition was performed slowly over a two hour period and was maintained at a constant 20° C. with good agitation. Upon completing the addition, the total mixture was permitted to age for 16 hours under the previously described conditions.

The reaction mixture was dissolved in 3.5 liters of water and precipitated as the water insoluble tetrafluoro borate salt. The resulting product was vacuum filtered and thoroughly washed to remove all residual acid. The product was vacuum dried to remove essentially all moisture.

The dried diazo polymer product was coated onto a plate as a 1.0% (w/w) solution in 2-methoxy ethanol. The substrate was aluminum which had been mechanically grained, anodically oxidized and rendered hydrophilic by immersion in hot aqueous polyvinyl phosphonic acid. The coating applied to the support, when dried, had a weight of 115 mg/M$^2$. The plate was exposed through a test negative contact flat using actinic radiation so that the plate received energy equal to 15.0 mJ/cm$^2$. The exposed plate was subtractively developed and inked with a conventional rub-up ink. Using a 21-step Stouffer wedge, a solid step 4½ with 3 ghost steps were observed.

Another plate prepared as described above, without being exposed. It was sectioned and placed into a 100° C. oven for aging. Samples were removed every 15 minutes and were then developed and inked. A plate is considered good until the background will not remain free of ink. For the diazo product of this example, the plate aged satisfactorily for 150 minutes.

The oligomeric mixture, prior to diazo condensation, was next analyzed by standard Thin Layer Chromatography (TLC) techniques to effect separation of reaction products. In this technique, the product suspected of being a mixture, is dissolved and the solution spotted on an adsorbent solid, for sample, a silica gel plate. After evaporation of the solvent, the plate is placed in a chamber and exposed to "developer" i.e. vapors from a reservoir of a selected solvent. The action of the developer causes the migration of the mixture components from its initial location in inverse proportion to its molecular weight. Progress and results are observed by exposure to ultraviolet light at 254 nm.

In this case the initial solvent was ethyl acetate and the developer was a mixture of ethyl acetate and hexane isomers (20:80 V/V).

To begin the test, the white precipitate set aside was dissolved in ethyl acetate and spotted via capillary tubes onto a TLC plate. As a control, pure 1,4-dimethylol benzene was spotted nearby. After development, corresponding to the reaction mixture, there were seven spots that had migrated and a spot that remained at the starting point. The pure monomer migrated to the same farthest distance observed with the reaction mixture. The separate spots were interperted as monomer, dimers, trimers, tetramers, etc. This qualitative separation and observation are quantitatively confirmed in Example 11 where larger quantities were separated and analyzed.

EXAMPLE 2

Using the same ingredients as described in Example 1, a diazo product was prepared by adding 25.7 gr of 1,4-dimethylol benzene to a solution containing 18.9 gr of 4-diazo diphenyl amine sulfate and 128.7 gr of 96% sulfuric acid (w/w) without the step of precondensation. The monomeric material was added slowly over a two hour period while maintaining constant agitation and a temperature of 20° C. Upon completing the addition, the mixture was aged for 16 hours. After aging, the reaction mixture was dissolved in 3.5 liters of water and precipitated as the water insoluble tetrafluoro borate salt. The resulting product was vacuum filtered and extensively washed to remove all residual acid. The product was vacuum dried to remove essentially all moisture.

In like manner as described in Example 1, plates were prepared to be tested for exposure and aging.

A plate having a coating weight of 112 mg/M$^2$ and exposed with 15.0 mJ/cm$^2$ had ½ of a solid step and 2 ghost steps showing one quarter the light speed of the product of Example 1. Aging at 100° C. was good up to 165 minutes. The example is representative of recent prior art, as in U.S. Pat. No. 3,867,147.

EXAMPLE 3

31.7 gr of 4,4'-Bis-methoxy methyl benzil was precondensed as a homocondensate in 48.0 gr of 96% sulfuric acid (w/w). The benzil monomer was slowly added to the acid over a period of 1 hour and was allowed to age for 4 hours. After aging, the slurry was added to a solution containing of 18.6 gr of 4-diazo diphenyl amine sulfate dissolved in 144.0 gr of sulfuric acid maintained at 8° C. and having constant agitation. Upon completing the addition, the mixture was aged at constant temperature for 18 hours after which time it was dissolved in 3.5 liters of water and subsequently precipitated as a hexafluorophosphate salt. The product was vacuum filtered and well washed. It was then vacuum dried to remove essentially all of the moisture. The dried product was tested in like manner as described in Example 1. There was a solid step 6½ and 3 ghost steps for comparison with the product of Example 4. Aging at 100° C. was good up to 150 minutes.

A sample of the homocondensate was further evaluated with TLC as also described in Example 1. It was found that most of the monomer had reacted to yield seven oligomers (including monomer) and an amount of non-migrating product.

EXAMPLE 4

31.7 gr of 4,4'-Bis-methoxy methyl benzil was not precondensed but was directly added to a solution consisting of 18.6 gr of 4-diazo diphenyl amine sulfate and 192.0 gr of 96% sulfuric acid (w/w) with constant agitation while maintaining a temperature of 8° C. After aging for 18 hours, the mixture was dissolved in 3.5 liters of water and precipitated as the hexafluorophosphate salt. After vacuum filtration, the product was dried to reomove essentially all of the moisture. The dried product was tested as in like manner as described in Example 1. An exposed plate had ¾ of a solid step 1 and 2 ghost steps or ⅛ the speed of the product of Example 3. Aging at 100° C. was good at 165 minutes.

EXAMPLE 5

3.7 gr of paraformaldehyde was dissolved in 48.0 gr of 96% sulfuric acid (w/w) with constant agitation while being held at 8° C. To the acid was then added 31.7 gr of 4,4'-Bis-methoxy-methyl benzil in a slow fashion with vigorous agitation. The slurry was allowed to age for 2 hours. After aging, the reaction mixture was added to a solution consisting of 192.0 gr of 96% sulfuric acid (w/w) and 18.6 gr of 4-diazo diphenyl amine sulfate. While adding, constant agitation and a temperature of 8° C. was maintained. The mixture was then allowed to age for 14 hours after which time it was divided into two equal parts. Each half was added to 2.0 liters of water. One half was precipitated as the hexafluorophosphate, filtered and dried. The other half was precipitated as the water soluble zinc chloride salt using standard techniques. The product was likewise filtered and dried.

The hexafluorophosphate diazo compound was, upon being sufficiently dried, made as a 1.0% (w/w) solution in 2-methoxy ethanol and subsequently tested as described in Example 1. The processed plate had a solid step 9 and 3 ghost steps or nearly double the speed of the product of Example 3. The zinc chloride diazo salt was prepared as a 1.0% (w/w) solution in deionized water and likewise tested. The resulting plate had a solid step 9 and 3 ghost steps. Upon aging at 100° C., both plates aged slightly less than 60 minutes with the hexafluorophosphate compound being slightly better than the zinc chloride compound.

Prior to the condensation reaction with the diazo monomer, the precondensed co-oligomer was spotted and likewise tested using the TLC procedure detailed in Example 1. The oligomer was separated into sixteen components. There was barely a trace of monomer remaining along with a large amount of non-migrating product indicating that in addition to a large number of isomers there was an increase in molecular weight.

EXAMPLE 6

28.2 gr of 1,4-(dimethyl methylol)benzene was slowly added to 89.3 gr of 85% phosphoric acid (w/w) already containing 18.2 gr of 3-methoxy-4-diazo diphenyl amine sulfate. During the addition process the mixture was well agitated and maintained at 40° C. Upon completing the addition, the reaction mixture was aged for 16 hours. After the prescribed time the mixture is added to 4.0 liters of water. The diazo product was precipitated as the tetrafluoro-borate salt. The compound was filtered and properly dried. As a 1.0% (w/w) solution in 2-methoxy ethanol, the diazo was functionally tested as described in Example 1. After exposure and development the plate had ½ of a solid step and 1½ ghost steps or ¼ the speed of the product of Example 1. At 100° C. the plates aged well up to 210 minutes.

EXAMPLE 7

3.8 gr of paraformaldehyde was slowly added over 2½ hours to a solution consisting of 18.2 gr of 3-methoxy-4-diazo diphenyl amine sulfate dissolved in 89.3 gr of 85% phosphoric acid (w/w). During the addition process and for the 16 hour aging period afterwards, the mixture was maintained at 40° C. with vigorous agitation. After the prescribed time the reaction mixture was added to 4.0 liters of water. The diazo product was precipitated as the tetrafluoro borate salt. The compound was filtered and properly dried. As a 1.0% (w/w) solution in 2-methoxy ethanol, the diazo was functionally tested as described in Example 1. After exposure and development the plate had ¼ of a solid step and 1 ghost step. At 100° C. the plates aged well up to 240 minutes. This example is representative of early prior art.

EXAMPLE 8

3.8 gr of paraformaldehyde was slowly added to 30.0 gr of 85% phosphoric acid (w/w) until it was totally dissolved. With vigorous agitation, 28.2 gr of 1,4-(dimethyl methylol)benzene was slowly added to the paraformaldehyde-acid solution at a constant temperature of 40° C. The mixture was allowed to age for 2 hours after which it was slowly added to a solution consisting of 59.3 gr of 85% phosphoric acid (w/w) and 18.2 gr of 3-methoxy-4-diazo diphenyl amine sulfate with vigorous agitation of 40° C.

After aging for 16 hours the reaction mixture was added to 4.0 liters of water and subsequently precipitated as the tetrafluoro borate salt. The compound was filtered and dried. As a 1.0% (w/w) solution in 2-methoxy ethanol, the diazo salt was functionally tested as described in Example 1. After exposure and development the plate had a solid step 8 and 3 ghost steps. At 100° C. the plate aged well up to 165 minutes.

As in Example 1, the paraformaldehyde 1,4(dimethyl methylol)benzene co-condensate was tested using TLC. After migration of the solvent, the silica slide was observed under UV. Thirteen distinct components were noted with very little monomer being present. A large amount of non-migrated residue was present.

EXAMPLE 9

28.2 gr of 1,4-(dimethyl methylol)benzene was slowly added to 30.0 gr of 85% phosphoric acid (w/w) having vigorous agitation at 40° C. In contrast to Example 6, the monomer was precondensed with itself first to form an oligomer. After two hours of aging, the precondensate was slowly added to the solution containing 18.2 gr of 3-methoxy-4-diazo diphenyl amine sulfate and 59.3 gr of phosphoric acid also maintained at 40° C. with good agitation. After 16 hours of aging, the reaction mixture was added to 4.0 liters of water and subsequently precipitated as the tetrafluoroborate salt. The compound was filtered and properly dried. As a 1.0% (w/w) solution in 3-methoxy ethanol, the diazo was functionally tested as described in Example 1. After exposure and development, the plate had a solid step 5½ and 2 ghost steps. At 100° C. the plate aged well up to 255 minutes.

When applying TLC to the precondensate before adding to the diazo-acid solution, the separation viewed under UV gave 8 steps with a moderate amount of residue that didn't migrate. There was also a moderate amount of unreacted monomer present.

EXAMPLE 10

32.2 gr of 3-methoxy-4-diazo diphenyl amine sulfate was dissolved in 142.0 gr of 85% phosphoric acid (w/w) and held at 40° C. with good agitation. To this solution 25.8 gr of 4,4'-Bis methoxy methyl diphenyl ether was slowly added. After the addition was complete, the reaction mixture was aged for 17 hours after which it was dissolved in 3.5 liters of water. The diazo product was precipitated as the mesitylene sulfonate. The precipitate was filtered and properly dried. As a 1.0% (w/w) solution in 3-methoxy ethanol, the diazo was functionally tested as described in Example 1. After exposure and development the plate had a solid step 2 and 2 ghost steps. At 100° C., the plates aged well up to 270 minutes.

EXAMPLE 11

43.9 gr of 4,4'-Bis-methoxy methyl diphenyl ether was slowly added to 35.5 gr of 85% phosphoric acid (w/w) and aged at room temperature for 2 hours with constant agitation. After aging, the precondensate was slowly added to a solution consisting of 32.2 gr of 3-methoxy-4-diazo diphenyl amine sulfate dissolved in 106.5 gr of 85% phosphoric acid (w/w) which was well agitated and maintained at 40° C. Upon completion of the addition, the reaction mixture was allowed to age for 17 hours after which it was dissolved in 3.5 liters of water. The diazo product was then precipitated as the mesitylene sulfonate after which it was filtered and properly dried. As a 1.0 solution in 3-methoxy ethanol, the diazo product was functionally tested as described in Example 1. After exposure and development the plate had 7½ solid steps with ghost steps. At 100° C., the plates aged well up to 180 minutes.

Using the TLC technique outlined in Example 1, nine components were observed under UV. An appreciable amount of monomer was present as well as some high molecular weight isomers that never migrated.

The assumption was made with the components were oligomers having increasing weight as a result of an increasing number of monomeric units reacting. To confirm the hypothesis and identify the chemical structures further, work was done exploying High Performance Liquid Chromatography (HPLC), Preparative Liquid Chromatography (PLC), and Nuclear Magnetic Resonance (NMR). With HPLC, the precondensed 4,4'-Bis methoxy methyl diphenyl ether, prior to adding to the diazo, but after aging, is separated. Whereas TLC showed 9 migrating oligomers, HPLC indicated 11. A 7½ gram sample of the precondensate was dissolved in 500 ml of ethyl acetate which in turn was used to charge a silica separation column. The column was sealed in a pressurized canister and had a pressurized mixture of ethyl acetate and hexane isomers (20:80 V/V) pass through it. As the carrier solvent blend passes through the silica, the lowest molecular weight isomers move the fastest and thus separation is effected. Using a UV source as a sensor, effective separation of the various fractions is observed. Each fraction is separately collected and rotor-vapor treated to eliminate the solvent thereby leaving only the pure extract. Each extract was subsequently analyzed with proton NMR for structure identification. The results of PLC and NMR are given in the following table:

| Fraction | % (W/W) | Amount (gr)* | Description based on NMR PRODUCT | Y Bridge |
|---|---|---|---|---|
| 1 | 25.0 | 1.525 | monomer | — |
| 2 | 5.6 | 0.342 | dimer | dimethylene ether |
| 3 | 9.4 | 0.573 | dimer | methylene |
| 4 | 9.8 | 0.598 | trimer | methylene |
| 5 | 17.7 | 1.080 | trimer | both methylene and dimethylene ether |
| 6 | 13.5 | 0.824 | trimer | same as #5 but with —OH termination |
| 7 | 19.0 | 1.158 | washout-tetramer and higher | |

*Of the 7.6 gr used initially, 1.5 gr did not dissolve and was therefore not separated by HPLC but rather was filtered off before charging the canister. The percentages and amounts therefore refer only to 6.1 gr recovered as fractions.

Each fraction was reacted with 4-diazo-diphenyl amine sulfate at a one-to-one mole ratio. The condensation reaction was performed in phosphoric acid at 40° C. The reaction mixture in each example was aged for 17 hours while providing constant agitation. After the specified time, the diazo product was dissolved in 200 ml of water and precipitated as the tetrafluoroborate salt. The precipitate was filtered and dried after which it was functionally tested as described in Example 1. The results appear below:

| Fraction | Solid Step | Ghost Step |
|---|---|---|
| 1 | 3 | 2 |
| 2 | 5½ | 3 |
| 3 | 5 | 3 |
| 4 | 7 | 3 |
| 5 | 7½ | 3 |
| 6 | 7½ | 3 |
| 7 | 10 | 4 |

These results show an increase in light speed of about 9 times from the slowest (Fraction 1) to the fastest (Fraction 7).

EXAMPLES 12 THROUGH 26

Using the key given below, further data is tabulated whereby various condensing monomers, diazo monomers, anions and condensing media are similarly compared. The functional testing was performed as in Example 1. Reaction conditions were within the range of previous examples.

Diazo Monomers

D-1 4-diazo-diphenyl amine sulfate
D-2 3-methoxy-4-diazo-diphenyl amine sulfate
D-3 3-methoxy-4-diazo-diphenyl amine chloride
D-4 2,5-diethoxy-4-diazo-(tolyl mercapto)-benzene.½ ZnCl$_2$
D-5 2,5-dibutoxy-4-diazo-(tolyl mercapto)-benzene.½ ZnCl$_2$

Condensing Monomers

R-1 styrene butadiene diol
R-2 3,3'-Bis-methoxy methyl-benzidine
R-3 4,4'-Bis-methoxy methyl-diphenyl ether
R-4 2,2-(4-hydroxy methyl-phenyl) propane
R-5 paraformaldehyde
R-6 4,4'-Bis-acetoxymethyl diphenyl methane

Anions (as isolated diazo product)

X-1 tetrafluoroborate
X-2 hexafluorophosphate
X-3 para toluene sulfonate
X-4 mesitylene sulfonate
X-5 chloride In the following examples, an asterisk indicates not precondensed, but added as a monomer as in prior art reactions:

| Example | Diazo Monomers | Condensing Monomers | Anion | Acid** | Solid | Ghost |
|---|---|---|---|---|---|---|
| 12 | D-1 | R-5* | X-1 | H$_3$PO$_4$ | 1½ | 2 |
| 13 | D-1 | R-3 + R-5 | X-1 | H$_3$PO$_4$ | 12 | 4 |
| 14 | D-1 | R-3 | X-1 | H$_3$PO$_4$ | 9 | 3 |
| 15 | D-2 | R-5* | X-2 | H$_3$PO$_4$ | 1 | 2 |
| 16 | D-2 | R-5 + R-3 | X-2 | H$_3$PO$_4$ | 11 | 4 |
| 17 | D-3 | R-6* | X-5 | H$_3$PO$_4$ | 2 | 2 |
| 18 | D-3 | R-6 | X-5 | H$_3$PO$_4$ | 7 | 3 |
| 19 | D-1 | R-1 | X-5 | H$_2$SO$_4$ | ½ | 2 |
| 20 | D-1 | R-1 | X-5 | H$_2$SO$_4$ | 3 | 3 |
| 21 | D-2 | R-2* | X-4 | H$_3$PO$_4$ | no image | |
| 22 | D-2 | R-2 | X-4 | H$_3$PO$_4$ | 1 | 2 |
| 23 | D-4 | R-3* | X-3 | H$_2$SO$_4$ | 2 | 3 |
| 24 | D-4 | R-3 | X-3 | H$_2$SO$_4$ | 6 | 3 |
| 25 | D-5 | R-4* | X-2 | H$_3$PO$_4$ | ¾ | 2 |
| 26 | D-5 | R-4 | X-2 | H$_3$PO$_4$ | 5 | 3 |

**H$_3$PO$_4$ is 85% w/w
H$_2$SO$_4$ is 96% w/w

The data from the examples demonstrate that precondensation to oligomers followed by condensation with diazo monomer results in higher speed reproduction layers than if such precondensation had not taken place. Further, the improvement in many instances is about four fold when using a crude reaction mixture of oligomers. However, if individual, higher oligomers are separated and condensed with diazo monomers, even greater light speeds are obtained.

What is claimed is:

1. A light sensitive, substantially linear polymeric diazonium reaction compound comprising repeating units of the condensation product of each of the general types $E^+X^-$ and Q, in which $E^+X^-$ is a radical of the compound of the general formula:

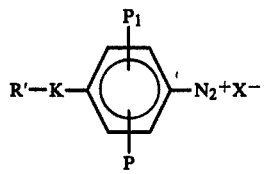

wherein:
—K— is selected from the group consisting of

—S—, —O—, and —CH$_2$—, or is absent;
R' is selected from the group consisting of phenyl and C$_1$ to C$_4$ alkyl substituted phenyl;
P and P$_1$ are selected from the group consisting of C$_1$ to C$_4$ alkyl, methoxy, ethoxy, butoxy, or H;
P$_1$ may be the same as P or different; and
$X^-$ is an anion; and is a radical of an oligomer having the structure:

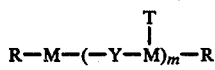

wherein:
R is selected from the group consisting of

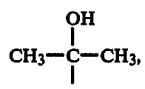

—CH$_2$OH, —CH$_2$O(CH$_2$)$_n$CH$_3$,

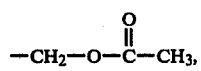

—CH$_2$Cl and —CH$_2$Br;
n is an integer from 0 to 3;
M is an aromatic radical selected from the group consisting of aromatic hydrocarbons, diaryl ethers, diaryl sulfides, diaryl sulfones, diaryl amines, diaryl ketones and diaryl diketones;
m is 1 to 6; Y is selected from the group consisting of —CH$_2$— or —CH$_2$—O—CH$_2$—bridge; and
T is the same as R when Y=—CH$_2$— and H— when Y=—CH$_2$—O—CH$_2$—;
wherein said diazonium compound is prepared by a two-step process consisting essentially of forming a precondensed oligomer component Q and reacting said component Q with radical $E^+X^-$ such that the ratio of M to $E^+X^-$ is at least 2:1; whereby said diazonium compound is capable of being substantially insolubilized when it is coated on a suitable substrate and exposed to a suitable light source at an energy level of 4 mJ/cm$^2$.

2. The compound of claim 1 wherein M is a radical of a diaryl ether.

3. The compound of claim 1 wherein M is a radical of diaryl sulfide.

4. The compound of claim 1 wherein M is a radical of diaryl amine.

5. The compound of claim 1 wherein M is a radical of diaryl ketone or diaryl diketone.

6. The compound of claim 1 wherein M is a radical of diaryl sulfide or diaryl sulfone.

7. The compound of claim 12 wherein M is a radical of an aromatic hydrocarbon selected from the group consisting of benzene, naphthalene, anthracene, biphenyl and diaryl alkane compounds.

8. The compound of claim 1 wherein M is a radical or diphenyl ether.

9. The compound of claim 1 or 8 wherein R is —CH$_2$O(CH$_2$)nCH$_3$.

10. The compound of claim 7 wherein Q is the condensation product of dimethylol benzene.

11. The compound of claim 7 wherein Q is the condensation product of di(dimethyl methylol)benzene.

12. The compound of claim 5 wherein Q is the condensation product of 4,4'-bis methoxy methyl benzil.

13. The compound of claim 1 wherein radical $E^+$ is selected from the group consisting of a diphenylamine—4—diazo and an alkoxy diphenylamine—4—diazo.

14. The compound of claim 13 wherein Q is the condensation product of a methoxy methyl diphenyl ether.

15. The light sensitive diazonium compound of claim 1 wherein the distance between diazonium groups in said polymeric diazonium compound is at least 5 Å.

16. The compound of claim 15 wherein said distance is at least 20 Å.

17. The compound of claim 1 wherein said compound has an average molecular weight of up to about 60,000.

18. The compound of claim 1 wherein Q is the condensation product of 4,4'bis methoxy methyl diphenyl ether.

19. A photosensitive composition comprising a light sensitive component wherein said light sensitive component consists essentially of a light sensitive, substantially linear polymeric diazonium reaction compound having repeating units of the condensation product of each of the general types $E^+X^-$ and Q, in which $E^+X^-$ is a radical of the compound of the general formula:

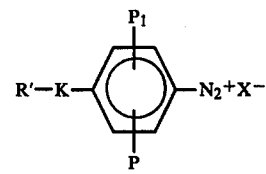

wherein:
—K— is selected from the group consisting of $$\begin{array}{c} H \\ | \\ -N- \end{array},$$

—S—, —O—, and —CH$_2$—, or is absent;
R' is selected from the group consisting of phenyl and C$_1$ to C$_4$ alkyl substituted phenyl;
P and P$_1$ are selected from the group consisting of C$_1$ to C$_4$ alkyl, methoxy, ethoxy, butoxy, or H;
P$_1$ may be the same as P or different; and
X$^-$ is an anion; and Q is a radical of an oligomer having the structure:

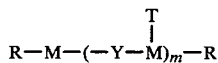

wherein:
R is selected from the group consisting of

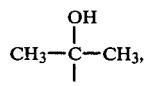

—CH$_2$OH, —CH$_2$O(CH$_2$)$_n$CH$_3$,

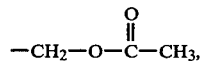

—CH$_2$Cl and —CH$_2$Br;
n is an integer from 0 to 3;
M is an aromatic radical selected from the group consisting of aromatic hydrocarbons, diaryl ethers, diaryl sulfides, diaryl sulfones, diaryl amines, diaryl ketones and diaryl diketones;
m is 1 to 6;
Y is selected from the group consisting of —CH$_2$— or —CH$_2$—O—CH$_2$—bridge; and
T is the same as R when Y=—CH$_2$— and H— when Y=—CH$_2$—O—CH$_2$—;
wherein said diazonium compound is prepared by a two-step process consisting essentially of forming a precondensed oligomer component Q and reacting said component Q with radical E$^+$X$^-$ such that the ratio of M to E$^+$X$^-$ is at least 2:1; whereby said diazonium compound is capable of being substantially insolubilized when it is coated on a suitable substrate and exposed to a suitable light source at an energy level of 4 mJ/cm$^2$.

20. The composition of claim 19 wherein Q is the condensation product of 4,4'-bis methoxy methyl diphenyl ether.

21. A light sensitive material comprising a substrate having a layer thereon, said layer comprising a light sensitive diazonium compound of claim 1.

22. A light sensitive material comprising a substrate having a layer thereon, said layer comprising a light sensitive diazonium composition of claim 19.

23. The light sensitive material of claim 21 or 22 wherein the substrate is comprised of aluminum.

24. A process for the preparation of a light sensitive, substantially linear polymeric diazonium reaction compound consisting essentially of forming a condensed oligomer component Q having the structure

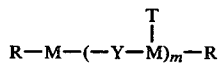

wherein:
R is selected from the group consisting of

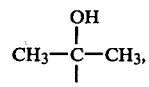

—CH$_2$OH, —CH$_2$O(CH$_2$)$_n$CH$_3$,

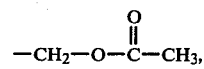

—CH$_2$Cl and —CH$_2$Br;
n is an integer from 0 to 3;
M is an aromatic radical selected from the group consisting of aromatic hydrocarbons, diaryl ethers, diaryl sulfides, diaryl sulfones, diaryl amines, diaryl ketones and diaryl diketones;
m is 1 to 6;
Y is selected from the group consisting of —CH$_2$— or —CH$_2$—O—CH$_2$—bridge; and
T is the same as R when Y=—CH$_2$— and H— when Y=—CH$_2$—O—CH$_2$—; and then reacting said component Q with a component E$^+$X$^-$ having the structure

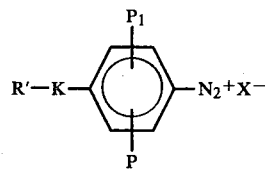

wherein:
—K— is selected from the group consisting of

—S—, —O—, and —CH$_2$—, or is absent;
R' is selected from the group consisting of phenyl and C$_1$ to C$_4$ alkyl substituted phenyl;
P and P$_1$ are selected from the group consisting of C$_1$ to C$_4$ alkyl, methoxy, ethoxy, butoxy, or H;
P$_1$ may be the same as P or different; and
X$^-$ is an anion;
such that the ratio of M to E$^+$X$^-$ is at least 2:1, thereby forming a reaction compound having repeating Q and E$^+$X$^-$ groups which reaction compound is capable of being substantially insolubilized when it is coated on a suitable substrate and exposed to a suitable light source at an energy level of 4 mJ/cm$^2$.

25. A process according to claim 24 in which said reacting to form the reaction compound is conducted in an acidic condensation medium in which the condensation medium is selected from the group consisting of sulfuric acid, phosphoric acid, phosphonic acid, hexafluorophosphoric acid, tetrafluoroboric acid, hydrochloric acid, and hydrobromic acid.

26. A process according to claim 25 in which the condensation medium is phosphoric acid.

27. The process of claim 24 wherein Q is selected from the group consisting of the condensation product of dimethylol benzene; the condensation product of di(dimethyl methylol)benzene; the condensation product of 4,4'-bis methoxy methyl benzil; and the condensation product of methoxy methyl diphenyl ether.

* * * * *

UNITED STATES PATENT AND TRADEMARK OFFICE
CERTIFICATE OF CORRECTION

PATENT NO. : 4,436,804
DATED : March 13, 1984
INVENTOR(S) : John E. Walls

It is certified that error appears in the above-identified patent and that said Letters Patent is hereby corrected as shown below:

In claim 1, Column 21, Line 35, after the word "and" insert the letter - - - Q - - -.

Signed and Sealed this

Eleventh Day of December 1984

[SEAL]

Attest:

GERALD J. MOSSINGHOFF

Attesting Officer     Commissioner of Patents and Trademarks